United States Patent [19]

Dueber et al.

[11] Patent Number: 4,613,560

[45] Date of Patent: Sep. 23, 1986

[54] PHOTOSENSITIVE CERAMIC COATING COMPOSITION

[75] Inventors: Thomas E. Dueber; David H. Scheiber, both of Wilmington; Howard E. Simmons, III, Newark, all of Del.

[73] Assignee: E. I. Du Pont de Nemours and Company, Wilmington, Del.

[21] Appl. No.: 687,460

[22] Filed: Dec. 28, 1984

[51] Int. Cl.$^4$ ............................................. G03C 1/68
[52] U.S. Cl. ..................... 430/286; 430/198; 430/281; 430/287; 430/330; 430/905; 430/910; 522/83
[58] Field of Search ............... 430/269, 270, 330, 198, 430/281, 286, 287, 905, 910; 427/96; 501/153; 522/71, 83

[56] References Cited

U.S. PATENT DOCUMENTS

| | | | |
|---|---|---|---|
| 3,355,291 | 11/1967 | Baird et al. | 430/198 |
| 3,443,944 | 5/1969 | Wise | 430/198 |
| 3,573,908 | 4/1971 | Minetti | 430/3 |
| 3,615,457 | 10/1971 | Seibert et al. | 430/198 |
| 3,877,950 | 4/1975 | Felten | 430/288 |
| 3,914,128 | 10/1975 | Scheiber et al. | 430/288 |
| 3,958,996 | 5/1976 | Inskip | 430/288 |
| 3,982,941 | 9/1976 | Inskip | 430/198 |

*Primary Examiner*—John E. Kittle
*Assistant Examiner*—José G. Dees

[57] ABSTRACT

A photosensitive ceramic coating composition which is fireable in a substantially nonoxidizing atmosphere comprising an admixture of:

(a) finely divided particles of ceramic solids having a particularly defined surface area-to-weight ratio and particle size, and
(b) finely divided particles of an inorganic binder having a particularly defined surface area-to-weight ratio and particle size, dispersed in an organic medium comprising
(c) an organic polymeric binder and
(d) a photoinitiation system, dissolved in
(e) photohardenable monomer and
(f) an volatile organic solvent.

6 Claims, No Drawings

PHOTOSENSITIVE CERAMIC COATING COMPOSITION

FIELD OF INVENTION

The invention relates to photosensitive ceramic coating compositions and, in particular, to such compositions in which the ceramic component is a dielectric material.

BACKGROUND OF THE INVENTION

Multilayer thick film circuits have been used for many years to increase circuit functionality per unit of area. Moreover, recent advances in circuit technology have placed new demands on dielectric materials for this use. Heretofore, most of the dielectric materials used in multiple circuits have been conventional thick film dielectric compositions. These are comprised of finely divided particles of dielectric solids and inorganic binders dispersed in an inert organic medium. Such thick film materials are usually applied by screen printing, though they may be applied by other means as well.

Thick film materials of this type are very important and will continue to be so. However, when applying these thick film materials by screen printing, it is difficult to obtain better than 8 mil (203 μm) line and space resolution. In fact, to obtain even this level of performance, it is essential that all the screen printing variables such as screen quality, squeegee hardness, print speed, dispersion properties, etc., be most carefully controlled and constantly monitored to obtain good product yields. Similar problems exist, of course, with the use of thick film conductor and resistor materials.

One approach to this problem is (1) to apply a layer of the dielectric material to a substrate by means of dispersion in a photosensitive medium, (2) to expose the layer imagewise to actinic radiation, (3) to solvent develop the pattern to remove unexposed portions of the layer, and (4) to fire the remaining exposed portions of the pattern to remove all remaining organic materials and to sinter the inorganic materials. This technique is revealed in several issued patents such as U.S. Pat. No. 3,443,944 to Wise, U.S. Pat. No. 3,615,457 to Seibert, U.S. Pat. No. 3,958,996 and U.S. Pat. No. 3,982,941 to Inskip, U.S. Pat. No. 3,877,950 to Felten and U.S. Pat. No. 3,914,128 to Scheiber et al. None of these systems utilizes an inorganic binder. However, U.S. Pat. No. 3,355,291 to Baird et al. and U.S. Pat. No. 3,573,908 to Minetti describe a method for applying glass to a semiconductor device by applying a photosensitive paste of the glass, exposing, solvent developing and firing the exposed areas.

Notwithstanding the effectiveness of the prior art processes for applying such electronic materials as a paste, it would be even better to apply such materials as a dimensionally stable film. There are several advantages to the use of film, including: (1) better surface uniformity, (2) better layer thickness uniformity, (3) a thicker layer can be applied, thus taking fewer steps to achieve thick fired dielectric layers, (4) greater processing uniformity, (5) longer storage life, (6) minimum sensitivity to dirt pickup, and (7) no significant change in viscosity as compared to the viscosity changes which take place in pastes due to drying on the printing screen. Consequently, there is a strongly unmet need for ceramic dispersions which can be applied by either conventional methods, such as screen printing where appropriate, or as a laminated film where more exciting properties are required.

SUMMARY OF THE INVENTION

In its primary aspect, the invention is directed to a photosensitive ceramic coating composition which is fireable in a substantially nonoxidizing atmosphere comprising an admixture of:

(a) finely divided particles of ceramic solids having a surface area-to-weight ratio of no more than 10 $m^2/g$ and at least 75 wt. % of the particles having a size of 1–10 μm.

(b) finely divided particles of an inorganic binder having a surface area-to-weight ratio of no more than 10 $m^2/g$ and at least 95 wt. %, of the particles having a size of 1–10 μm, the weight ratio of (b) to (a) being 0.6–2, dispersed in an organic medium comprising (c) an organic polymeric binder selected from the group consisting of (1) homopolymer and copolymers of $C_{1-10}$ alkyl acrylates, $C_{1-10}$ alkyl methacrylates, alpha-methylstyrene and 0–2 wt. % ethylenically unsaturated carboxylic acid, amine or silane-containing compounds, (2) homopolymers and copolymers of $C_{1-10}$ mono-olefins, (3) homopolymers and copolymers of $C_{1-4}$ alkylene oxide and mixtures thereof, the binder comprising 5–25 wt. % basis total inorganic solids, and (d) a photoinitiation system, dissolved in (e) photohardenable monomer and (f) volatile nonaqueous organic solvent.

In a secondary aspect, the invention is directed to a photosensitive ceramic film comprising a layer of the above-described photosensitive composition from which the solvent has been removed by volatilization.

In a still further aspect, the invention is directed to a patterned ceramic layer comprising the above-described photosensitive ceramic film which has been: (1) laminated to a ceramic substrate, (2) exposed imagewise to actinic radiation to effect hardening of the exposed areas of the film, (3) solvent developed to remove unexposed areas of the film, and (4) fired in a substantially nonoxidizing atmosphere to effect volatilization of the organic medium and sintering of the inorganic binder and ceramic solids.

DETAILED DESCRIPTION OF THE INVENTION

A. Ceramic Solids

The invention is applicable to virtually any high melting inorganic solid material. However, it is particularly suitable for making dispersions of dielectric solids such as alumina, titanates, zirconates and stannates. It is also applicable to precursors of such materials, i.e., solid materials which upon firing are converted to dielectric solids, and to mixtures of any of these.

Among the many dielectric solids which are likely to be used in the invention are $BaTiO_3$, $CaTiO_3$, $SrTiO_3$, $PbTiO_3$, $CaZrO_3$, $BaZrO_3$, $CaSnO_3$, $BaSnO_3$, and $Al_2O_3$. As will be apparent to those skilled in the ceramic arts, the exact chemical composition of the ceramic solids to be used in the composition of the invention is not ordinarily critical in the rheological sense. It is also preferred that the ceramic solids not have swelling characteristics in the organic dispersion since the rheological properties of the dispersion may be substantially changed thereby.

It has been found that the dispersion of the invention must contain no significant amount of solids having a particle size of less than 0.3 μm in order to obtain adequately complete burnout of the organic medium when the films or layers thereof are fired to remove the organic medium and to effect sintering of the inorganic binder and the ceramic solids. However, none of the ceramic solids may exceed 20 μm and, furthermore, at least 75 wt. % of the ceramic solids must have a size of 1-10 μm. When the dispersions are used to make thick film pastes, which are usually applied by screen printing, the maximum particle size must not exceed the thickness of the screen, and when the dispersion is used to make dry photosensitive film, the maximum particle size must not exceed the thickness of the film. It is preferred that at least 90 wt. % of the ceramic solids fall within the 1-10 μm range.

In addition, it is preferred that surface area/weight ratio of the ceramic particles not exceed 10 $m^2/g$ for the reason that such particles tend to affect adversely the sintering characteristics of the accompanying inorganic binder. It is still further preferred that the surface area/weight ratio not exceed 5 $m^2/g$. Ceramic particles having a surface area/weight ratio of 1-5 have been found to be quite satisfactory.

B. Inorganic Binder

The glass frit used in the present invention aids in sintering the inorganic crystalline particulates and may be of any well known composition which has a melting temperature below that of the ceramic solids. Nevertheless, in order to get adequate hermeticity of the devices, it is preferred that the glass transition temperature ($T_g$) of the inorganic binder be 550°-825° C. and still more preferably 575°-750° C. If melting takes place below 550° C., organic material will likely be encapsulated and blisters will tend to form in the dielectric layer as the organics decompose. On the other hand, a glass transition temperature above 825° C. will tend to produce a porous dielectric when sintering temperatures compatible with copper metallizations, e.g., 900° C., are used.

The glass frits most preferably used are the borosilicate frits, such as lead borosilicate frit, bismuth, cadmium, barium, calcium or other alkaline earth borosilicate frits. The preparation of such glass frits is well known and consists, for example, in melting together the constituents of the glass in the form of the oxides of the constituents and pouring such molten composition into water to form the frit. The batch ingredients may, of course, be any compound that will yield the desired oxides under the usual conditions of frit production. For example, boric oxide will be obtained from boric acid, silicon dioxide will be produced from flint, barium oxide will be produced from barium carbonate, etc. The glass is preferably milled in a ball mill with water to reduce the particle size of the frit and to obtain a frit of substantially uniform size. It is then settled in water to separate fines and the supernatant fluid containing the fines is removed. Other methods of classification may be used as well.

The glasses are prepared by conventional glassmaking techniques, by mixing the desired components in the desired proportions and heating the mixture to form melt. As is well known in the art, heating is conducted to a peak temperature and for a time such that the melt becomes entirely liquid and homogeneous. In the present work, the components are premixed by shaking in a polyethylene jar with plastic balls and then melted in a platinum crucible at the desired temperature. The melt is heated at the peak temperature for a period of 1 to 1½ hours. The melt is then poured into cold water. The maximum temperature of the water during quenching is kept as low as possible by increasing the water-to-melt ratio. The crude frit after separation from water is freed of residual water by drying in air or displacing the water by rinsing with methanol. The crude frit is then ball milled for 3-5 hours in alumina containers using alumina balls. Alumina contamination of the frit is not within the observable limit of x-ray diffraction analysis.

After discharging the milled-frit slurry from the mill, excess solvent is removed by decantation and the frit powder is air dried at room temperature. The dried powder is then screened through a 325-mesh screen to remove any large particles. The inorganic binder, like the ceramic solids, should have a surface-to-weight ratio of no more than 10 $m^2/g$ and at least 95 wt. % of the particles should have a particle size of 1-10 μm.

It is preferred that the 50% point of the inorganic binder, which is defined as equal parts by weight of both larger and smaller particles, be equal to or less than that of the ceramic solids. For given particle size ceramic solids, the inorganic binder/ceramic solids ratio required to achieve hermeticity will decrease as the inorganic binder size decreases. With a given ceramic solids-inorganic binder system, if the ratio of inorganic binder to ceramic solids is significantly higher than that required to achieve hermeticity, the dielectric layer tends to form blisters on firing. If the ratio is significantly lower, the fired dielectric will be porous and therefore nonhermetic.

Within the above-described particle size and surface area limits, it is nevertheless preferred that the inorganic binder particles be 1-6 μm. The reason for this is that smaller particles having a high surface area tend to adsorb the organic materials and thus impede clean decomposition. On the other hand, larger size particles tend to have poorer sintering characteristics. It is preferred that the ratio of inorganic binder to ceramic solids be 0.6-2.

C. Organic Polymeric Binder

As set out hereinabove, the binder component of the dispersion of the invention is an organic polymeric binder selected from the group consisting of (1) homopolymer and copolymers of $C_{1-10}$ alkyl acrylates, $C_{1-10}$ alkyl methacrylates, alpha-methylstyrene and 0-2 wt. % ethylenically unsaturated carboxylic acid, amine or silane-containing compounds, (2) homopolymers and copolymers of $C_{1-10}$ mono-olefins, (3) homopolymers and copolymers of $C_{1-4}$ alkylene oxide and mixtures thereof, the binder comprising 5-25 wt. % basis total inorganic solids.

The above-described polymers include homopolymers as well as random copolymers and higher multipolymers. The relative quantity of carboxylic acid or amine distributed along the polymer chains should be no more than 2.0 wt. %. Because they are cleaner burning in low-oxygen atmospheres, methacrylic polymers, especially poly(methyl methacrylate), are preferred over acrylic polymers.

It is preferred that the comonomers containing functional moieties not exceed 10.0 wt. % of any one polymer or 2.0% in the polymer mixture to avoid flocculation of the dispersed ceramic solids. In some instances, it has been observed that polymer mixtures having as low as 1.8% acid-containing monomers may be borderline or even unsatisfactory with respect to dispersion characteristics. In most instances of this kind, such polymers can, nevertheless, still be used in the invention by employing a more polar solvent. Thus, while a polymer mixture containing as much as 2.0% monomer-containing functional groups can be used, such polymer mixtures having only 1.5% functional monomers are preferred. No more than 1.0 wt. % of such functional monomers is still further preferred. It is also preferred for the same reason that none of the polymers contained in the polymeric mixture contain more than 10.0 wt. % functional comonomer. Thus, the polymeric binder can be a mixture of polymers, some of which contain no functional moieties at all and some of which contain as much as 10.0 wt. % functional comonomers so long as the content of functional comonomers in the total mixture is within the range of 0.2–2.0 wt. %. On the other hand, it is preferred that the polymeric binder be comprised mostly of methacrylic polymers as defined above which contain 0–5.0 wt. % functional comonomer.

Suitable copolymerizable carboxylic acids include ethylenically unsaturated $C_{3-6}$ monocarboxylic acids such as acrylic, methacrylic and crotonic acids and $C_{4-10}$ dicarboxylic acids such as fumaric, itaconic, citraconic, vinyl succinic and maleic acids as well as their half esters and, where appropriate, their anhydrides and mixtures thereof. Because they are cleaner burning in low-oxygen atmospheres, methacrylic polymers are preferred over acrylic polymers.

It is, of course, recognized that certain amine constituents cannot be incorporated in the chain directly by copolymerization of the amine-containing monomer but may be incorporated indirectly by postpolymerization reaction of a pendant reactive moiety of the polymer chain. Illustrative of this are primary amines which can be added by reaction of glycidyl compounds with pendant carboxylic acid groups in the presence of ammonia. Thus, as used herein, the term "ethylenically unsaturated amine" is intended to include polymers derived from both amine-containing comonomers as well as other comonomers which have been postpolymerizationally reacted to form amine groups thereon. Primary, secondary and tertiary amines are each effective in a similar manner. Suitable comonomers for direct incorporation of pendant amine groups into the binder polymer chain include diethylaminoethyl methacrylate, dimethylaminoethyl methacrylate and t-butylaminoethyl methacrylate. Suitable comonomers which yield pendant functional moieties suitable for postpolymerization reaction to incorporate amine functionality include the above-described ethylenically unsaturated viz. epoxides such as glycidyl acrylate or glycidyl methacrylate.

Within the above-described limits for the nonacidic comonomers, it is preferred that the alkyl acrylate or methacrylate constitute at least 75 and preferably 80 wt. % of the polymer.

The polymeric binder can contain up to about 10 wt. % of other nonacrylic and nonacidic comonomers such as styrene, acrylonitrile, vinyl acetate, acrylamide and the like, so long as the previously discussed compositional criteria are met as well as the physical criteria mentioned below. However, it is preferred to use not more than about 5 wt. % of such monomers because they are more difficult to burn out cleanly. At present, the use of such other comonomers is not known to add to the efficacy of the copolymers in their application to the invention. However, such comonomers in the above-listed amounts do not detract from the effectiveness of the polymers so long as all the compositional and physical property criteria are met.

In addition to the above described acrylic and methacrylic polymers, various polyolefins such as polyethylene, polypropylene, polybutylene, polyisobutylene, and ethylene-propylene copolymer can also be used. Also useful in the invention are the so-called polyethers which are polymers of lower alkylene oxides, such as polyethylene oxide, polypropylene oxide and polybutylene oxide.

In addition to the above-described compositional parameters, certain physical properties of the polymeric binder are, of course, important. In particular, it will be recognized by those skilled in the photoresist art that the unexposed binder polymer must be substantially developable in whatever solvent developer is used. On the other hand, the photohardened binder must have sufficient solvent resistance that it is not washed off by the developer solvent.

Polymers meeting these criteria can be made by those skilled in the art of acrylate polymerization by conventional solution polymerization techniques. Typically, such acidic acrylate polymers are prepared by combining an alpha, beta-ethylenically unsaturated acid with one or more copolymerizable vinyl monomers in a relatively low boiling (75°–150° C.) organic solvent to obtain a 20 to 60% solution of the monomer mixture, then subsequently causing the monomers to polymerize by the addition of a polymerization catalyst and heating the mixture at the reflux temperature of the solution at atmospheric pressure. After the polymerization reaction is essentially complete, the resulting acid polymer solution is cooled to room temperature and samples are removed to determine the viscosity, molecular weight, acid equivalent, etc. of the polymer.

D. Photoinitiation System

Suitable photoinitiation systems are those which are thermally inactive but which generate free radicals upon exposure to actinic light at or below 185° C. These include the substituted or unsubstituted polynuclear quinones which are compounds having two intracyclic carbon atoms in a conjugated carbocyclic ring system, e.g., 9,10-anthraquinone, 2-methylanthraquinone, 2-ethylanthraquinone, 2-tert-butylanthraquinone, octamethylanthraquinone, 1,4-naphthoquinone, 9,10-phenanthrenequinone, benz(a)anthracene-7,12-dione, 2,3-naphthacene-5,12-dione, 2-methyl-1,4-naphthoquinone, 1,4-dimethyl-anthraquinone, 2,3-dimethylanthraquinone, 2-phenylanthraquinone, 2,3-diphenylanthraquinone, retenequinone, 7,8,9,10-tetrahydronaphthracene-5,12-dione, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin. Photoreducible dyes and reducing agents disclosed in U.S. Pat. Nos. 2,850,445, 2,875,047, 3,097,096, 3,074,974, 3,097,097, and 3,145,104, as well as dyes of the phenazine, oxazine, and quinone classes, Michler's ketone, benzophenone, 2,4,5-triphenylimidazolyl dimers with hydrogen donors including leuco dyes and mixtures thereof as described in U.S. Pat. Nos. 3,427,161, 3,479,185, and 3,549,367 can be used as initiators. Also useful with photoinitiators and photoinhibitors are sensitizers disclosed in U.S. Pat. No. 4,162,162. The photoinitiator or photoinitiator system is present in 0.05 to 10% by weight based on the total weight of the dry photopolymerizable layer.

E. Photohardenable Monomer

The photohardenable monomer component of the invention is comprised of at least one addition polymerizable ethylenically unsaturated compound having at least one polymerizable ethylenic group. Such compounds are capable of forming a high polymer by free radical initiated, chain propagating addition polymerization. Preferably, the unsaturated compound (monomer) has at least two terminal ethylenically unsaturated groups, e.g., 2 to 4 groups. The monomeric compounds are nongaseous. That is, they have a normal boiling point above 100° C. and a plasticizing action on the organic polymeric binder.

Suitable monomers which can be used alone or in combination with other monomers include t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di-(p-hydroxyphenyl)propane dimethacrylate, di-(3-methacryloxy-2-hydroxypropyl)ether of bisphenol-A, di-(2-methacryloxyethyl)ether of bisphenol-A, di-(3-acryloxy-2-hydroxypropyl)ether of bisphenol-A, di-(2-acryloxyethyl)ether of bisphenol-A, di-(3-methacryloxy-2-hydroxypropyl)ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Particularly preferred monomers are polyoxyethylated trimethylolpropane triacrylate, ethylated pentaerythritol triacrylate, dipentaerythritol monohydroxypentaacrylate and 1,10-decanediol dimethylacrylate. The unsaturated monomeric component is present in an amount of 5 to 45% by weight based on the total weight of the dry photopolymerizable layer.

Particularly preferred photohardenable monomers for use in the invention because of their superior burn-out characteristics are certain mono-, di- and tri-functional methacrylates corresponding to the following chemical structures:

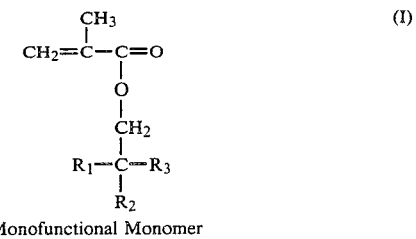
Monofunctional Monomer (I)

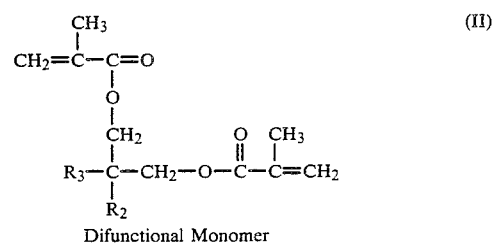
Difunctional Monomer (II)

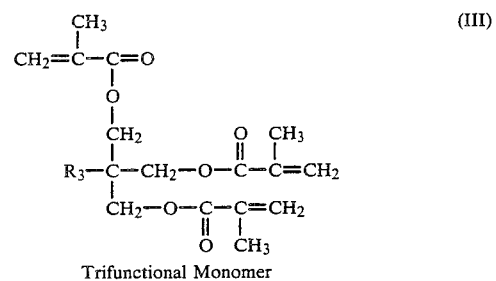
Trifunctional Monomer (III)

In all of the above three types of methacrylic monomers, the alpha-carbon must have 2 or 3 hydrogen atoms substituents depending on whether the beta-carbon is present (2 hydrogen atoms) or absent (3 hydrogen atoms). In addition, if the beta-carbon is absent, it is replaced by a hydrogen atom as is the case with methyl methacrylate. On the other hand, if the beta-carbon is present, $R_1$, $R_2$ and $R_3$ are independently selected from alkyl, aryl or aralkyl groups or, if one of the three R groups is H, then the other two R groups are preferred to be selected from alkyl, aryl or aralkyl groups. Examples of the former are 2,2-dimethylpropane dimethacrylate (DMPDMA) and trimethylolpropane trimethacrylate (TMPTMA).

Minor amounts of other components can be present in the photopolymerizable compositions, e.g., pigments, dyes, thermal polymerization inhibitors, ashesion promoters, such as organosilane coupling agents, plasticizers, coating aids such as polyethylene oxides, etc. so long as the photopolymerizable compositions retain their essential properties. Organosilanes are particularly useful in quantities of 3.0 wt. % or less based on the weight of the inorganic particles. Treated particles have a lower demand for organics. Thus, the level of organics in the coating can be reduced, which results in easier burnout upon firing. The organosilane can also improve the dispersion properties and allow a lower inorganic binder/ceramic solids ratio at equivalent hermeticity.

F. Organic Medium

The main purpose of the organic medium is to serve as a vehicle for dispersion of the finely divided solids of the composition in such form that it can readily be applied to a ceramic or other substrate. Thus, the organic medium must first be one in which the solids are dispersible with an adequate degree of stability. Secondly, the rheological properties of the organic medium must be such that they lend good application properties to the dispersion.

When the dispersion is to be made into a film, the organic medium in which the ceramic solids and inorganic binder are dispersed consists of the above-described polymeric binder, monomer and initiator which are dissolved in a volatile organic solvent and, optionally, other dissolved materials such as plasticizers, release agents, dispersing agents, stripping agents, antifouling agents and wetting agents.

The solvent component of the organic medium, which may be a mixture of solvents, is chosen so as to obtain complete solution therein of the polymer and to be of sufficiently high volatility to enable the solvent to be evaporated from the dispersion by the application of relatively low levels of heat at atmospheric pressure. In addition, the solvent must boil well below the boiling point and decomposition temperature of any other additives contained in the organic medium. Thus, solvents having atmospheric boiling points below 150° C. are used most frequently. Such solvents include benzene, acetone, xylene, methanol, ethanol, methylethyl ketone, 1,1,1-trichloroethane, tetrachloroethylene, amyl acetate, 2,2,4-triethyl pentanediol-1,3-monoisobutyrate, toluene, methylene chloride, and ethylene glycol monoalkyl and dialkyl ethers such as ethylene glycol mono-n-propyl ether. For casting films, methylene chloride is particularly preferred because of its volatility.

Frequently the organic medium will also contain one or more plasticizers which serve to lower the $T_g$ of the binder polymer. Such plasticizers help to assure good lamination to ceramic substrates and enhance the developability of unexposed areas of the composition. However, the use of such materials should be minimized in order to reduce the amount of organic materials which must be removed when the films cast therefrom are fired. The choice of plasticizers is, of course, determined primarily by the polymer which must be modified. Among the plasticizers which have been used in various binder systems are diethyl phthalate, dibutyl phthalate, butyl benzyl phthalate, dibenzyl phthalate, alkyl phosphates, polyalkylene glycols, glycerol, poly(ethylene oxides), hydroxy ethylated alkyl phenol, tricresyl phosphate triethyleneglycol diacetate and polyester plasticizers. Dibutyl phthalate is frequently used in acrylic polymer systems because it can be used effectively in relatively small concentrations.

The photosensitive compositions of the invention will frequently be employed as the photosensitive layer of a resist element in which the photosensitive layer is coated upon a support film.

In conventional photoresist elements, it is necessary, or at least highly desirable, to protect the photosensitive layer by a removable cover sheet in order to prevent blocking between the photosensitive layer and the reverse surface of the support when they are stored in roll form. It is also desirable to protect the layer laminated to a substrate by means of the removable support film during imaging exposure to prevent blocking between the layer and the phototool.

The photopolymerizable composition is coated upon the support film at a dry coating thickness of about 0.001 inch (~0.0025 cm) to about 0.01 inch (~0.025 cm) or more. A suitable strippable support which preferably has a high degree of dimensional stability to temperature changes may be chosen from a wide variety of films composed of high polymers, e.g., polyamides, polyolefins, polyesters, vinyl polymers, and cellulose esters and may have a thickness of from 0.0005 inch (~0.0013 cm) to 0.008 inch (~0.02 cm) or more. If exposure is to be made before removing the strippable support, it must, of course, transmit a substantial fraction of the actinic radiation incident upon it. If the strippable support is removed prior to exposure, no such restrictions apply. A particularly suitable support is transparent polyethylene terephthalate film having a thickness of about 0.001 inch (~0.0025 cm).

When an element contains no removable, protective cover sheet and is to be stored in roll form, the reverse side of the strippable support preferably has applied thereto a thin release layer of a material such as wax or silicone to prevent blocking with the photopolymerizable stratum. Alternatively, adhesion to the coated photopolymerizable layer may be preferentially increased by flame treating or electrical discharge treating the support surface to be coated.

Suitable removable, protective cover sheets when used may be chosen from the same group of high polymer films described above and may have the same wide range of thicknesses. A cover sheet of 0.001 inch (~0.0025 cm) thick polyethylene is especially suitable. Supports and cover sheets as described above provide good protection to the photopolymerizable resist layer during storage prior to use.

It is preferred that the weight ratio of the inorganic solids (dielectric and glass) to organics be within the range of 2.0 to 6.0 and, more preferably, from 2.6 to 4.5. A ratio of no more than 6.0 is necessary to obtain adequate dispersion and rheological properties. However, below 2.5, the amount of organics which must be burned off is excessive and the quality of the final layers suffers. The ratio of inorganic solids to organics is dependent on the particle size of the inorganic solids, the organic components and on surface pretreatment of the inorganic solids. When the particles are treated with organosilane coupling agents, the ratio of inorganic solids to organics can be increased. It is preferred to use a lower level of organics to minimize firing defects. It is especially important that the ratio of inorganics to organics be as high as possible. Organosilanes suitable for use in the invention are those corresponding to the general formula $RSi(OR')_3$ in which R' is methyl or ethyl and R is selected from alkyl, methacryloxypropyl, polyalkylene oxide or other organic functional groups which interact with the organic matrix of the film.

On the other hand, when the dispersion is to be applied as a thick film paste, conventional thick film organic media can be used with appropriate rheological adjustments and the use of lower volatility solvents.

When the compositions of the invention are formulated as thick film compositions, they will usually be applied to a substrate by means of screen printing. Therefore, they must have appropriate viscosity so that they can be passed through the screen readily. In addition, they should be thixotropic in order that they set up rapidly after being screened, thereby giving good resolution. While the rheological properties are of primary importance, the organic medium is preferably formulated also to give appropriate wettability of the solids and the substrate, good drying rate, dried film strength sufficient to withstand rough handling and good firing properties. Satisfactory appearance of the fired composition is also important.

In view of all these criteria, a wide variety of inert liquids can be used as organic media. The organic medium for most thick film compositions is typically a solution of resin in a solvent and, frequently, a solvent solution containing both resin and thixotropic agent. The solvent usually boils within the range of 130°-350° C.

Especially suitable resins for this purpose are polymethacrylates of lower alcohols and monobutyl ether of ethylene glycol monoacetate.

The most widely used solvents for thick film applications are terpenes such as alpha- or beta-terpineol or mixtures thereof with other solvents such as kerosene, dibutylphthalate, butyl carbitol, butyl carbitol acetate, hexamethylene glycol and high boiling alcohols and alcohol esters. Various combinations of these and other solvents are formulated to obtain the desired viscosity and volatility requirements for each application.

Among the thixotropic agents which are commonly used are hydrogenated castor oil and derivatives thereof. It is, of course, not always necessary to incorporate a thixotropic agent since the solvent/resin properties coupled with the shear thinning inherent in any suspension may alone be suitable in this regard.

The ratio of organic medium to inorganic solids in the dispersions can vary considerably and depends upon the manner in which the dispersion is to be applied and the kind of organic medium used. Normally, to achieve good coverage, the dispersions will contain complementally by weight 60-90% solids and 40-10% organic medium. Such dispersions are usually of semifluid consistency and are referred to commonly as "pastes".

The pastes are conveniently prepared on a three-roll mill. The viscosity of the pastes is typically within the following ranges when measured at room temperature on Brookfield viscometers at low, moderate and high shear rates:

| Shear Rate (Sec$^{-1}$) | Viscosity (Pa · s) | |
| --- | --- | --- |
| 0.2 | 100-5000 | — |
| | 300-2000 | Preferred |
| | 600-1500 | Most preferred |
| 4 | 40-400 | — |
| | 100-250 | Preferred |
| | 140-200 | Most preferred |
| 384 | 7-40 | — |
| | 10-25 | Preferred |
| | 12-18 | Most preferred |

The amount and type of organic medium (vehicle) utilized is determined mainly by the final desired formulation viscosity and print thickness.

Various dyes and pigments may also be added to increase visibility of the photo image. Any colorant used, however, should preferably be transparent to the actinic radiation used, although it may be opaque or strongly absorb other radiation in the visible or UV spectral region.

In addition to the many parameters of properties and composition described above, it is also essential that all of the components—both inorganic and organic—be substantially free of halogens. The reason for this is that under normal firing conditions, halogenated compounds cause corrosion of adjoining conductive layers as well as the surfaces of the furnace in which they are fired.

EXAMPLES

Component Materials

In the examples which are set out below, the following component materials were used having the indicated properties:

A. Inorganics

Glass frit: Ferro[11] glass #3467 ball milled in water, fractionated and dried to give a surface area ranging from 1.3 to 2.2 m$^2$/g; composition (component mole %): lead oxide (5.6), silicone dioxide (68.1), boron oxide (4.7), alumina (6.5), calcium oxide (11.1), sodium oxide (2.8) and potassium oxide (1.3).

Alumina: Aluminum oxide (Al$_2$O$_3$); particle size $>0.5\mu$; 90% $<5\mu$; Surface area 3-4.5 m$^2$/g.

Pigment: Cobalt aluminate (CoAl$_2$O$_4$).

Silicon dioxide: milled quartz; 8 m$^2$/g.

Colloidal zinc oxide.

Antimony pentoxide.

Glass ceramic.

B. Polymeric Binders

Copolymer of 98% methylmethacrylate, 2% methacrylic acid $\overline{M}_w=25M$, acid No. 9, inherent viscosity* 0.183±0.011, $T_g=106°$ C.

Copolymer of 95.5% methylmethacrylate, 4.5% ethyl acrylate, $\overline{M}_w=50M$, $T_g=96°$ C., inherent viscosity 0.399±0.011.

Polyisobutylmethacrylate, $\overline{M}_w=60M$; $T_g=50°$ C., inherent viscosity 0.635±0.045.

Polymethylmethacrylate, $\overline{M}_w=200M$; $T_g=105°$ C., inherent viscosity 1.252±0.115 (*).

(*) Inherent viscosity of a solution that contains 0.25 g polymer in 50 ml of methylene chloride measured at 20° C. using a No. 50 Cannon-Fenske viscometer.

C. Monomers

TEOTA 1000: Polyoxyethylated trimethylolpropane triacrylate; $\overline{M}_w=1162$.

Chemlink ®[1]176: Ethylated pentaerythritol triacrylate (Sartomer); $M_w=326$.

TMPTMA: Trimethylol propane trimethacrylate (Sartomer); $\overline{M}_w=338$.

Dipentaerythritol monohydroxypentaacrylate (Sartomer): $\overline{M}_w=524$.

Epocryl ®[2]303: Diacrylate of epichlorohydrin condensation product with bisphenol-A (Shell).

Decanediol dimethacrylate (Sartomer): $\overline{M}_w=310$.

Pentaerylthritol triacrylate (Sartomer): $\overline{M}_w=298$.

Polyethylene glycol 200 dimethacrylate (Sartomer): $\overline{M}_w=330$.

D. Plasticizers

Dibutylphthalate.

Dioctylphthalate.

Butyl benzyl phthalate.

Plasticizer SC: Mixture of triethylene glycol dicaprate and triethylene glycol dicaprylate.

Tricresyl phosphate.

Pluronic[3] 31Rl: Block copolymer of ethylene oxide and propylene oxide.

Triethylene glycol diacetate.

E. Initiators

Michler's ketone: 4,4'-bis-N,N-dimethylaminobenzophenone.
Ethyl Michler's ketone: 4,4-bis-N,N-diethylaminobenzophenone.
Benzophenone.
Irgacure ®[4]651: benzil dimethylketal.
Irgacure ®184: 1-hydroxycyclohexyl phenyl ketone.
2-t-butylanthraquinone
Bis-(N-ethyl-1,2,3,4-tetrahydro-6-quinolyl) ketone (ETQK).

F. Others

Halation Protection Cyasorb ®[5]UV24: 2,2'-dihydroxy-4-methoxybenzophenone.
Resolution and Exposure Lattitude Improvement Di-t-butylmethane nitroso dimer.
Antioxidant Ionol ®[6]: 2,6-di-t-butyl-4-methylphenol.
Coating Aid Polyox ®[7] WSRN-3000 Polyethylene oxide; $\overline{M}_w = 200M$.

PREPARATION OF DIELECTRIC FILMS

A. Preparation of Mill Base

All of the ceramic components, glass frit, silicon dioxide, alumina, pigment and any other inorganic material are mixed with 6 g of copolymer of methylmethacrylate/methacrylic acid (98/2) and 80.0 g methylene chloride. The mixture is ball milled in a half-pint (234 mL) mill jar half-filled with burundum (alumina) cylinders 0.5 inch (1.27 cm) in both diameter and length for four hours. The dispersion is filtered through a 325-mesh screen. The dispersion is stirred or jar-rolled until coated.

B. Preparation of Coating Dispersion

The percent solids is determined in order to calculate the amount of other components to be added. After all the additional components are in solution, excess solvent is removed by mechanically stirring the dispersion in a vented area and allowing solvent to evaporate until a viscosity of 700–900 cps, as determined with a Brookfield viscometer, is obtained. The dispersion is filtered through a 325-mesh screen.

C. Coating Procedure

The dispersion is coated on a Talboys coater on 92A or 92D Mylar ®[8] [1 mil (0.0025 cm)] polyethylene terephthalate film with a 5.4 mil doctor knife positioned above the base which is driven at 6 ft (183 cm)/min. The film is passed through a 12 ft (366 cm) air impingement heater at 130°–175° F. (54°–79 C.) before it is wound up with a polyethylene cover sheet. The thickness of the coated film is 1.8 mils (0.0046 cm).

D. Process Conditions

Care is taken to avoid dirt contamination in the process of preparing coating compositions and in preparing dielectric parts since such contamination can lead to defects in the fired dielectric. The process work is best done in a class-100 clean room. The film is laminated to degreased alumina parts that contain a fired conductor pattern. The parts are degreased ultrasonically in chlorothene (1,1,1-trichloroethane) and baked in a vacuum oven at 50°–100° C. to remove the degreasing solvent. The film is laminated with a hot-roll laminator, manufactured by Western Magnum Co., Hermosa Beach, CA with rolls covered with neoprene having a Durometer rating of 50 when heated to the lamination temperature of 100°–110° C. The film is laminated to the part at a speed of 0.5 ft (15.2 cm)/min. More than one pass through the laminator can be used to assure better adhesion and conformation around copper metallizations.

The parts are exposed with either a Berkey-Askor[9] vacuum printer or a collimated HTG[10] UV exposure source after a 60-sec nitrogen purge with the HTG source of 60-sec drawdown in the vacuum printer in contact with the phototarget. The optimum exposure time is determined from an exposure series that yields information on the best exposure to yield the correct size vias or photoformed holes in the dielectric after development.

The exposed parts are developed using a spin developer using a 6–8 sec, 50 psi spray of chlorothene developer with the part spinning at 2500 rpm, followed by a 2–10 sec air stream at 50 psi to dry the part. The developer is sprayed perpendicular to the spinning part. A flat-spray jet pattern was obtained with a 0.125 in (0.318 cm) JJ air atomizing nozzle from Spraying Systems Co., Wheaton, IL with setup J23 as described in Industrial Catalog 27. The solvent flow may be 50 to 2000 mL/min, preferably 300 mL/min. The nozzle-to-part distance may be 0.5 in (1.27 cm) to 8 in (20.35 cm) with a typical distance being 1.5 in (3.81 cm).

The developed parts are dried in a forced draft oven at 75° C. for 15 min and fired in a furnace with peak temperature of 900° C. over a two-hour cycle. In firing the composition of the invention, they are exposed to a substantially nonoxidizing atmosphere up to the glass transition temperature of the inorganic binder and to an essentially completely nonoxidizing atmosphere during the sintering phase of the firing step.

By the term "substantially nonoxidizing atmosphere" is meant an atmosphere which contains insufficient oxygen to effect any significant oxidation of copper metal, but which nevertheless contains sufficient oxygen to effect oxidation of the organic materials. In practice, it has been found that a nitrogen atmosphere of 100–1000 ppm $O_2$ is appropriate in the presintering phase of the firing step. From 300 to 800 ppm $O_2$ is preferred. The amount of oxygen is increased as the thickness of the dielectric layer increases. For one layer of dielectric film that fires out to 25 µm, 300 to 400 ppm $O_2$ is sufficient. For two layers of dielectric film that fires out to 50 µm, 600 to 800 ppm $O_2$ is preferred. On the other hand, the essentially completely nonoxidizing atmosphere used during the glass sintering step of the firing step refers to a nitrogen atmosphere containing only residual amounts of $O_2$, e.g., about 10 ppm. It is preferred to fire the composition of the invention at low heating rates in order to minimize physical defects in the fired layer.

The fired parts are tested for hermeticity by determining the wet dissipation factor (DF) by application of water on top of capacitors made therefrom. The capacitance in picofarads (PF) is measured and the relative dielectric constant is calculated. The capacitors are comprised of an underlying copper metallization, 40–50 µm thick fired dielectric, and an overlying copper metallization.

The 50 µm thick fired dielectric can be obtained either by firing one film to a 25 µm thick dielectric layer and repeating the procedure or by cofiring two layers of dielectric film. A top layer film optimized for less light absorption than the bottom layer can be used so that adequate light penetration through the bottom layer is obtained. This allows formation of vias with vertical sidewalls. Alternatively, the first layer of dielectric can be exposed but not developed before the second layer is laminated thereon. Then, after the second layer is laminated and exposed, both layers are developed simultaneously.

E. Test Procedures

A capacitor is formed from the above-described dielectric film comprising a copper disk having an area of 1 cm² and a contact tab supported on an alumina substrate. Overlying the copper disk is a layer of the dielectric film and overlying the dielectric layer is a second copper disk of the same size having a contact tab rotated 90°–180° with respect to the lower tab.

Capacitance and dissipation factors are measured at 1 kHz using a Hewlett-Packard HP4274A multi-frequency LCR meter, while insulation resistance is measured using a Super megohm meter Model RM 170 (Biddle Instruments, AVO, Ltd., U.K.). Insulation resistance measurements are made after charging the capacitor to 100 VDC. Each number is the average of at least 10 measurements. The thickness of the dielectric layer is measured using a Gould Surfanalyzer 150/recorder 250. The dielectric constant is calculated using the equation:

$$K = (C/A) \cdot t,$$

wherein

C is the capacitance of the capacitor;

A is the area of small electrode in contact with the dielectric layer; and t is the thickness of the dielectric layer.

All capacitors were aged for at least 15 hours after firing before making the electrical measurements. It is common that the dissipation factor (DF) decreases by 0.5–2% within this aging time period. However, capacitance is generally unaffected during this period.

Dissipation factor on a wet basis is determined by placing a drop of water on the upper copper disk so that it wets the disk but not the contact tab. After standing for 30 seconds, DF is determined in the usual manner. The dielectric is considered to be hermetic when the wet DF is less than 1%. Below 0.5% is preferred.

EXAMPLES 1–4

Using the above-described components and procedures four different photosensitive dielectric films were prepared having the compositions indicated in Table 1 below:

TABLE 1

| | Preparation of Dielectric Films- Composition-Glass/Alumina Ratio | | | |
|---|---|---|---|---|
| Example No. | 1 | 2 | 3 | 4 |
| Mill Base | | g | | |
| Glass frit (surface 2.06 m²/g) | 75.00 | 77.83 | 78.70 | 231.43 |
| Alumina (surface area 3.4 m²/g) | 50.00 | 47.17 | 46.30 | 128.57 |
| Cobalt aluminate | 0.12 | 0.12 | 0.12 | 0.34 |
| Copolymer of 98/2 methyl-methacrylate/methacrylic acid ($\overline{M}_w$ = 25 M; Tg 105° C., acid No. 9) | 6.00 | 6.00 | 6.00 | 17.30 |
| Methylene chloride | 80.0 | 80.0 | 80.0 | 230.5 |
| Glass/Alumina (by wt.) | 1.5 | 1.65 | 1.7 | 1.8 |

| Dispersion | g Added to Dispersion/% By Weight of Solids | | | |
|---|---|---|---|---|
| | | | | |
| Glass frit | —/44.46 | —/46.14 | —/46.66 | —/47.64 |
| Alumina | —/29.64 | —/27.96 | —/27.44 | —/26.46 |
| Cobalt aluminate | —/0.07 | —/0.07 | —/0.07 | —/0.07 |
| Copolymer in dispersions | 15.93/13.43 | 5.63/12.43 | 15.90/13.43 | 11.96/13.43 |
| Dibutyl-phthalate | 9.28/5.75 | 3.65/5.75 | 9.26/5.75 | 6.97/5.75 |
| Polyoxy-ethylated trimethylol propane triacrylate $\overline{M}_w$ = 1162 | — | 3.65/5.75 | — | — |
| Ethylated pentaery-thritol triacrylate | 9.28/5.75 | — | 9.26/5.75 | 6.97/5.75 |
| Benzo-phenone | 1.21/0.75 | 0.47/0.75 | 1.21/0.75 | 0.91/0.75 |
| Michler's ketone | 0.08/0.05 | 0.03/0.05 | 0.08/0.05 | 0.06/0.05 |
| di-t-butyl-nitroso methane dimer | 0.16/0.10 | 0.06/0.10 | 0.16/0.10 | 0.12/0.10 |
| Benzyl dimethyl ketal | — | 0.63/1.0 | — | — |
| g Dispersion | 199.06 | 77.57 | 199.37 | 150.12 |
| % Solids | 62.99 | 63.56 | 62.81 | 62.78 |

The film from Example 4 was fabricated into capacitors by building up two layers of dielectric fired separately atop a copper conductive metallization. Upon completion of the two dielectric layers, an upper conductor metallization was printed thereon and fired. Process conditions used for the fabrication procedure were as follows:

Lamination: 2 passes through rolls at 100°–110° C.

Exposure: 1 min with 2 KW mercury lamp in a Berkey-Askor 24"×28" (61.0 cm×71.1 cm) vacuum printer distance from lamp to vacuum frame 20 in (50.8 cm).

Spin developer: 1,1,1-trichloroethane sprayed on part spinning at 2500 rev/min for 6 sec followed by a 2 sec air stream for drying.

Oven drying: 75° C. for 15 min.

Firing: N₂ belt furnace with less than 1000 ppm O₂: peak temperature 900° C., 2.7 hour cycle. Gas flow was 315 ft³/hr. (8.9 in³/hr.).

The fired film from Examples 1–4 had no apparent defects but the film from Example 1 was noticeably porous. Application of an ink solution (Ranger rubber stamp nonsmear ink) showed considerable absorption into the fired dielectric that would not wash off. In comparison, the fired dielectric of Example 2 had only a trace of ink absorption and that of Examples 3 and 4 had none.

Even though the above-described capacitors were fired without any apparent defects, the capacitors of Example 1 were nonhermetic and those of Example 2 were borderline in their hermeticity. However, the capacitors of Examples 3 and 4 had quite good hermetic properties. In particular, the capacitors of Example 4 had wet DF of 0–0.5% with a relative dielectric constant (K) of 8.0.

Films from all of the examples were exposed through a via resolution photomask under the conditions described above. When they were developed also as described above, they produced images with well resolved 4 mil vias.

EXAMPLE 5

A further dielectric film similar to those of Examples 1–4 was prepared in which a small amount of quartz was added to the mill base to raise the softening point of the glass frit. The relevant compositions of the film are given in Table 2 below:

TABLE 2

| Properties of Dielectric Films- Composition-Quartz Addition | |
|---|---|
| Example No. | 5 |
| Mill Base | g |
| Glass frit of Examples 1–4 | 78.78 |
| Alumina of Examples 1–4 | 43.77 |
| Cobalt aluminate | 0.12 |
| Milled quartz, surface area 8 m$^2$/g | 2.45 |
| Copolymer of Example 1–4 | 6.00 |
| Methylene chloride | 80.00 |
| Glass/Alumina (by wt.) | 1.8 |
| Dispersion | |
| Glass frit | —/46.70 |
| Alumina | —/25.95 |
| Cobalt aluminate | —/0.07 |
| Quartz | —/1.45 |
| Copolymer in dispersions | 15.92/13.43 |
| Dibutylphthalate | 9.27/5.75 |
| Ethylated pentaerythritol triacrylate | 9.27/5.75 |
| Benzophenone | 1.21/0.75 |
| Michler's ketone | 0.08/0.05 |
| Di-t-butylnitrosomethane dimer | 0.16/0.10 |
| g Dispersion | 199.04 |
| % Solids | 62.91 |

Process conditions were the same as for Examples 1–4. The fired parts were free of defects.

The film of Example 5 was found to retard the tendency of blisters to occur in the overlying conductor layer upon multiple firing. This is attributed to the higher softening point of the quartz-doped frit which reduces the tendency of the glass to migrate into the conductor layer.

EXAMPLES 6–8

Three further photosensitive dielectric films were made in which different monomers were used. The relevant compositions of the films are given in Table 3 below:

TABLE 3

| Preparation of Dielectric Films- Composition-Monomer Variations | | | |
|---|---|---|---|
| Example No. | 6 | 7 | 8 |
| Mill Base | | g | |
| Glass frit of Examples 1–4 | 236.00 | 231.43 | 231.43 |

TABLE 3-continued

| Preparation of Dielectric Films- Composition-Monomer Variations | | | |
|---|---|---|---|
| Example No. | 6 | 7 | 8 |
| Alumina of Examples 1–4 | 124.20 | 128.57 | 128.57 |
| Cobalt aluminate | — | 0.34 | 0.34 |
| Copolymer of Examples 1–4 | 17.30 | 17.30 | 17.30 |
| Methylene chloride | 230.53 | 231.50 | 231.50 |
| Glass/Alumina (by wt.) | 1.9 | 1.8 | 1.8 |
| Dispersion | g Added to Dispersion/% By Weight of Solids | | |
| Glass frit | —/48.65 | —/47.64 | —/47.64 |
| Alumina | —/25.60 | —/26.46 | —/26.46 |
| Cobalt aluminate | — | —/0.07 | —/0.07 |
| Copolymer of Examples 1–4 | 2.93/12.49 | 4.22/13.43 | 4.96/13.43 |
| Polyoxyethylated trimethylolpropane triacrylate $\overline{M}_w = 1162$ | 1.89/5.76 | — | — |
| Dipentaerythritol monohydroxy pentaacrylate | — | 2.46/5.75 | — |
| Diacrylate of condensation product of ephichlorohydrin and bisphenol-A | — | — | 2.89/5.75 |
| 1,10-decanediol-dimethacrylate | 1.89/5.76 | — | — |
| Dibutylphthalate | — | 2.46/5.75 | 2.89/5.75 |
| Benzophenone | 0.49/1.5 | 0.32/0.75 | 0.38/0.75 |
| Michler's ketone | — | 0.02/0.05 | 0.04/0.05 |
| ETQK | 0.02/0.05 | — | — |
| Cyasorb UV 24 | 0.03/0.1 | — | — |
| Di-t-butylnitrosomethane dimer | 0.03/0.1 | 0.04/0.10 | 0.05/0.10 |
| g Dispersion | 40.61 | 55.77 | 49.94 |
| % Solids | 62.82 | 72.00 | 72.00 |

The processing condition for the above films were the same as for Examples 1–4 and all of the fired compositions had no significant defects.

EXAMPLE 9

In this example, a dielectric film was made in which two polymeric binders were used. The relevant compositions of the film are given in Table 4 below:

TABLE 4

| Properties of Dielectric Films- Composition-Dual Binders | |
|---|---|
| Example No. | 9 |
| Mill Base | g |
| Glass frit of Examples 1–4 | 78.78 |
| Alumina of Examples 1–4 | 43.77 |
| Silicone dioxide (quartz of Example 5) | 2.45 |
| Cobalt aluminate | 0.12 |
| Copolymer of Examples 1–4 | 6.00 |
| Methylene chloride | 80.00 |
| Glass/Alumina (by wt.) | 1.8 |
| Dispersion | |
| Glass frit | —/46.70 |
| Silicone dioxide | —/1.45 |
| Alumina | —/25.95 |
| Cobalt aluminate | —/0.07 |
| Copolymer of Examples 1–4 | 12.47/11.05 |
| Copolymer of 95.5% methyl methylacrylate 4.5% ethyl acrylate $\overline{M}_w = 50$ M, Tg 96° C. | 3.63/2.18 |
| Dibutylphthalate | 9.57/5.75 |
| Polyoxyethylated trimethylolpropane triacrylate | 9.57/5.75 |
| Benzophenone | 1.25/0.75 |
| Michler's ketone | 0.08/0.05 |
| Di-t-butylnitrosomethane dimer | 0.17/0.1 |
| 2,6-di-t-butyl-4-methylphenol | 0.33/0.20 |
| g Dispersion | 201.11 |

TABLE 4-continued

Properties of Dielectric Films-
Composition-Dual Binders

| Example No. | 9 |
|---|---|
| % Solids | 64.31 |

The film was processed as described in Examples 1–4 and yielded fired dielectrics having a wet DF of 0.12±0.04 for 10 capacitors and no significant defects.

EXAMPLES 10 AND 11

Two further film compositions were prepared in which the top dielectric layer composition was adjusted to provide for lower light absorption and to allow more light penetration through to the underlying dielectric layer. The organic content was also reduced to give better fireability. The relevant compositions of the film are given in Table 5 below. The dispersion of Examples 10 and 11 was obtained from the mill base described below.

TABLE 5

Preparation of Dielectric Films-
Composition-Light Absorption and Fireability

| Component | g |
|---|---|
| Glass frit of Examples 1–4 | 236.00 |
| Alumina of Examples 1–4 | 124.20 |
| Copolymer of Examples 1–4 | 17.30 |
| Methylene chloride | 230.53 |
| Glass/Alumina (by wt.) | 1.9 |

| | Example No. | |
|---|---|---|
| | 10 | 11 |
| Dispersion | g Added to Dispersion/% By Weight of Solids | |
| Glass frit | —/52.41 | —/48.55 |
| Alumina | —/27.59 | —/25.55 |
| Copolymer of Examples 1–4 | 11.12/9.42 | 19.50/12.68 |
| Dibutylphthalate | 10.92/5.48 | 12.27/5.74 |
| Trimethylolpropane triacrylate | 7.97/4.00 | — |
| Polyoxyethylated trimethylol propane triacrylate | — | 12.27/5.74 |
| Benzyl dimethylketal | 1.99/1.00 | — |
| Benzophenone | — | 3.21/1.5 |
| Bis-(N—ethyl-1,2,3,4-tetrahydro-6-quinolyl) ketone | — | 0.11/0.05 |
| Di-t-butylnitroso-methane dimer | 0.20/0.10 | 0.21/0.10 |
| 2,2'-dihydroxy-4-methoxybenzophenone | — | 0.21/0.10 |
| g Dispersion | 265.62 | 265.85 |
| % Solids | 62.91 | 62.44 |

The film of Example 10 was laminated to the bottom layer film of Example 11. As with the bottom layer, the top layer was laminated with two passes through the laminator. Except that both layers were imaged, developed and fired together, the film was processed as for Examples 1–4 to yield a 38 μm thick dielectric. Relative dielectric constant was 8.0, % DF=0.1. The top layer film was 1.3 mils and the bottom layer film was 1.5 mils thick. There were no significant defects.

EXAMPLE 12

An additional film composition was prepared in which the glass frit and alumina were surface pretreated with a silane coupling agent and a polymeric binder without acidic functionality was used. The glass frit and alumina are separately treated in 2 kg quantities in a Patterson-Kelley, twin-shell V blender with the silane coupling agent pressure-fed over 10 min. as a 4% solution in 95% ethanol containing a trace of glacial acetic acid. The sample was mixed for 10 additional minutes with the intensifier bar in motion during the entire mixing. The sample was dried 1 hour at 105° C. The organic level was reduced to give better fireability. The dispersion composition is given in Table 6 below.

TABLE 6

Preparation of Dielectric Film

| Mill Base | |
|---|---|
| Glass frit of Examples 1–4 surface pretreated with 0.5 wt. % of γ-methacryloxypropyl-trimethoxysilane | 215.43 g |
| Alumina of Examples 1–4 surface pretreated as the glass frit | 119.68 |
| Cobalt aluminate | 0.32 |
| Copolymer of 95.5% methylmethacrylate 4.5% ethyl arylate, $M_w = 50$ M, $T_g = 96°$ C. | 16.10 |
| Methylene chloride | 214.5 |
| Glass/alumina (by wt.) | 1.8 |

| Dispersion | g Added to Dispersion/% By Weight of Solids |
|---|---|
| Glass frit | —/50.07 |
| Alumina | —/27.81 |
| Cobalt Aluminate | —/0.06 |
| Copolymer of mill base | 6.06/10.49 |
| Polyoxyethylated trimethylol propane triacrylate | 3.53/3.93 |
| Dibutyl phthalate | 2.95/3.28 |
| Benzyl isooctyl phthalate | 2.94/3.27 |
| Michler's ketone | 0.04/0.04 |
| Benzophenone | 0.58/0.64 |
| Di-t-butylnitrosomethane dimer | 0.08/0.09 |
| Ionol ®[(6)] | 0.15/0.17 |
| Polyethylene oxide, $\overline{M}_w = 200$ M | 0.14/0.15 |
| g Dispersion | 116.39 |
| % Solids | 63.05 |

The film was processed as described in Examples 1–4 except that two pieces of film were prelaminated together at 1 ft/min (30.5 cm/min). One of the cover sheets was removed and the composite was laminated at 0.5 ft/min (15.2 cm/min) to the test substrate. The excess film was cut away and the part was passed two times through a laminator with the orientation changed 180° after the first pass to assure good adhesion and conformation around elevated conductor features. The part was exposed for 20 seconds with a HTG source at 16 mW/cm² and spin developed for 14 seconds in chlorothene. The developed part was baked 15 minutes at 75° C. followed by 1 hour at 250° C. The part was fired using a two-hour cycle at 1.7 in/min (4.32 cm/min) in an 8-zone belt furnace with the oxygen concentration reaching a maximum of 500 ppm and a peak temperature of 900° C. Capacitors prepared as described above were 50 μm in thickness and had a dielectric constant of 6.7 and wet DF of 0.5 and had no significant defects.

EXAMPLE 13

An additional film composition utilizing a polymeric binder having a basic component was prepared as given in Table 7:

TABLE 7

Dispersion Containing Basic Polymeric Binder

| Mill Base | g |
|---|---|
| Glass frit of Examples 1–4 with | 75.00 |

TABLE 7-continued

Dispersion Containing Basic Polymeric Binder

| | |
|---|---|
| 1 wt. % surface treatment with γ-methacryloxypropyl trimethoxy silane | |
| Alumina of Examples 1–4 surface pretreated as the glass frit | 50.00 |
| Cobalt aluminate | 0.10 |
| Terpolymer of ethylmethacrylate/methyl acrylate/diethylamino ethyl methacrylate 62.3/37.1/0.6 $\overline{M}_w$ = 127 M; $\overline{M}_n$ = 77 M; 30.32% solids in methyl ethyl ketone | 19.91 |
| Methylene chloride | 80.0 |
| Glass/alumina (by wt.) | 1.50 |

| Dispersion | g Added to Dispersions/% By Weight of Solids |
|---|---|
| Glass frit | —/46.73 |
| Alumina | —/31.15 |
| Cobalt Aluminate | —/0.06 |
| Terpolymer of mill base | —/3.74 |
| Copolymer of Example 12 | 5.37/7.49 |
| Polyoxyethylated trimethylol propane triacrylate | 3.49/4.87 |
| Dibutyl phthalate | 3.49/4.87 |
| Michler's ketone | 0.03/0.04 |
| Benzophenone | 0.46/0.64 |
| Di-t-butylnitrosomethane dimer | 0.06/0.09 |
| Ionol ®[6] | 0.12/0.17 |
| Polyethylene oxide, $\overline{M}_w$ = 300 M | 0.11/0.15 |
| g Dispersion | 100.69 |
| % Solids | 58.12 |

The film was processed as described for Example 12 to yield defect-free dielectric.

EXAMPLE 14

An additional film composition was prepared in which the glass frit and alumina were surface pretreated with a polypropylene oxide-containing organosilane ester in the same manner as Example 12. This is deemed to be the best mode of practicing the invention. The dispersion composition is given in Table 8 below.

TABLE 8

Preparation of Dielectric Film

| Mill Base | g |
|---|---|
| Glass frit of Examples 1–4 with 0.5 wt. % surface treatment with Union Carbide Y9883[12], a polypropylene oxide containing organosilane ester | 1844.0 |
| Alumina of Examples 1–4 with 0.5 wt. % Y9883 | 1418.0 |
| Cobalt Aluminate | 3.08 |
| Copolymer of Example 12 | 156.6 |
| Methylene Chloride | 1827 |

| Dispersion | g Added to Dispersion/% By Weight of Solids |
|---|---|
| Glass Frit | —/44.02 |
| Alumina | —/33.86 |
| Cobalt Aluminate | —/0.07 |
| Copolymer of Mill Base | 251.6/10.48 |
| Polyoxyethylated Trimethylolpropane Triacrylate | 146.7/3.93 |
| Dibutyl Phthalate | 122.4/3.28 |
| Benzyl Isooctyl Phthalate | 122.1/3.27 |
| Michler's Ketone | 1.5/0.04 |
| Benzophenone | 23.9/0.64 |
| Di-t-butylnitrosomethane Dimer | 3.4/0.09 |
| Ionol ®[6] | 6.3/0.17 |
| Polyethylene Oxide, $\overline{M}_w$ = 200 M | 5.6/0.15 |
| g Dispersion | 4676.5 |

TABLE 8-continued

Preparation of Dielectric Film

| | |
|---|---|
| % Solids | 65.2 |

The dispersion was jar rolled at 32 revolutions per minute for 4 hours in a 2.3 gal (8.7 l) mill jar containing 19.5 lbs. (8.8 kg) of 0.5 in (1.27 cm) burundum cylinders. The rest of the film components were added after the % solids of the dispersion was determined. The dispersion was stirred mechanically overnight and then 1 hr. magnetically with mild agitation to remove air from the dispersion. The dispersion % solids was 70.4% and the viscosity was 680 centipoise as measured with a Brookfield viscometer (No. 6 spindle at 50 rpm). The dispersion was filtered through a 20 micron polypropylene filter and extrusion die-coated to a thickness of 1.75 mils (0.044 mm) on 1 mil (0.0025 cm) silicone-treated polyethylene terephthalate. This coating was then laminated to a second coating of the same dispersion coated as above on 0.5 mil (0.00125 cm) polyethylene terephthalate. The lamination pressure was 11 to 12 psi (0.77 to 0.84 kg/cm$^2$). The coatings before lamination were dried in three 8 ft. (2.44 m) long dryer zones with the 1st zone at 120° F. (48.9° C.), the 2nd zone at 140° F. (60° C.) and the 3rd zone at 200° F. (93.3° C.).

The film was processed in the same manner as Example 12 except that the dielectric film was laminated directly to the test substrate. After the laminate was cooled to room temperature, the cover sheet was pulled off, removing the excess film from the edges of the part. The part was baked for 10 min in an 105° C. convection oven and, after a N$_2$ purge, exposed to actinic light through a photomask which was slightly removed from the photopolymer surface. Exposure was carried out for 20 sec with a HTG source at 16 mW/cm$^2$ and then spin developed for 12 sec in 1,1,1-trichloroethane. The developed part was baked for 15 min at 75° C. and fired as Example 12 to yield a dielectric layer of 50 microns with well resolved 12 mil (304.8 micron) vias. The resulting dielectric coating had no significant defects.

[1] Trademark of Sartomer Co., West Chester, PA, for acrylate monomers.
[2] Trademark of Shell Chemical Co., Houston, TX, for epoxy resin acrylates.
[3] Trademark of BASF-Wyandotte, Wyandotte, MI for nonionic surface active agents.
[4] Trademark of Ciba-Geigy Corp., Yardsley, NY for curing agents activated by ultraviolet light.
[5] Trademark of American Cyanamid Corp., Bound Brook, NJ for light stabilizers.
[6] Trademark of Shell Chemical Co., Houston, TX for hindered phenolic antioxidants.
[7] Trademark of Union Carbide Corp., Morristown, NJ for water-soluble ethylene oxide polymer resins.
[8] Trademark of E. I. du Pont de Nemours and Company, Inc., for polyester film.
[9] Berkey Technical Div., Berkey Photo Inc., Woodside, NJ.
[10] The Hybrid Technology Group Inc., San Jose, CA.
[11] Trademark of Ferro Corporation, Cleveland, OH for glass frit.
[12] Tradename of Union Carbide Corp., Morristown, NJ for poly(propylene oxide)-containing organosilane ester.

We claim:

1. A photosensitive ceramic coating composition which is fireable in a substantially nonoxidizing atmosphere comprising an admixture of:
   (a) finely divided particles of ceramic solids having a surface area-to-weight ratio of no more than 10 m²/g and at least 75 wt. % of the particles having a size of 1-10 μm, and
   (b) finely divided particles of an inorganic binder having a glass transition temperature of 550°-825° C., a surface area-to-weight ratio of no more than 10 m²/g and at least 95 wt. % of the particles having a size of 1-10 μm, the weight ratio of (b) to (a) being 0.6-2, dispersed in an organic medium comprising
   (c) an organic polymeric binder selected from the group consisting of (1) homopolymer and copolymers of $C_{1-10}$ alkyl acrylates, $C_{1-10}$ alkyl methacrylates, alpha-methylstyrene and 0-2 wt. % ethylenically unsaturated carboxylic acid, amine or silane-containing compounds, (2) homopolymers and copolymers of $C_{1-10}$ mono-olefins, and (3) homopolymers and copolymers of $C_{1-4}$ alkylene oxide and mixtures thereof, the binder comprising 5-25 wt. % basis total inorganic solids, and
   (d) a photoinitiation system, dissolved in
   (e) photohardenable monomer, the monomer comprising 5-45% wt. of the dry photopolymerizable layer and
   (f) an volatile organic solvent.

2. The composition of claim 1 in which the organic polymeric binder is a copolymer of 95.5 wt. % methylmethacrylate and 4.5 wt. % ethyl acrylate.

3. The composition of claim 1 in which the photohardenable monomer is poly(oxyethylated trimethylolpropane triacrylate).

4. The composition of claim 1 in which the ceramic solids and inorganic binder have been surface treated with an organosilane ester coupling agent.

5. A photosensitive ceramic film comprising a layer of the composition of claim 1 from which the organic solvent has been removed by volatilization.

6. The composition of claim 1 which is a paste in which the organic medium is comprised of solvents having an atmospheric boiling range of 130°-350° C.

* * * * *